United States Patent [19]
Gamo

[11] Patent Number: 5,484,962
[45] Date of Patent: Jan. 16, 1996

[54] ELECTRICAL DEVICE PROVIDED WITH THREE TERMINALS

[75] Inventor: Masao Gamo, Nagaokakyo, Japan

[73] Assignee: Murata Mfg. Co., Ltd., Japan

[21] Appl. No.: 176,726

[22] Filed: Jan. 3, 1994

[30] Foreign Application Priority Data

Jan. 12, 1993 [JP] Japan ..................... 5-003232

[51] Int. Cl.⁶ ..................................... H05K 1/18
[52] U.S. Cl. .................. 174/261; 361/767; 361/772; 439/83; 439/78
[58] Field of Search ............... 361/772, 773, 361/774, 775, 760, 767, 813; 174/261, 267; 439/81, 83, 78; 257/666

[56] References Cited

U.S. PATENT DOCUMENTS

| | | | |
|---|---|---|---|
| 3,689,684 | 9/1972 | Cox, Jr. et al. | 174/68.5 |
| 3,750,252 | 8/1973 | Landman | 29/191.6 |
| 4,737,115 | 4/1988 | Siedler | 439/83 |
| 4,991,666 | 2/1991 | Septfons et al. | 174/261 |

*Primary Examiner*—Laura Thomas
*Attorney, Agent, or Firm*—Ostrolenk, Faber, Gerb & Soften

[57] ABSTRACT

An input leading electrode, an output leading electrode and a common leading electrode are provided on a first side of an element which has a specified electrical function. The element is held between an input terminal and an output terminal which face to the first side of the element and a common terminal which faces to a second side of the element. The output terminal and the input terminal are connected with the leading electrodes by ordinary soldering, and the common terminal and the common leading electrode are bridged with solder.

4 Claims, 3 Drawing Sheets

F I G. 5
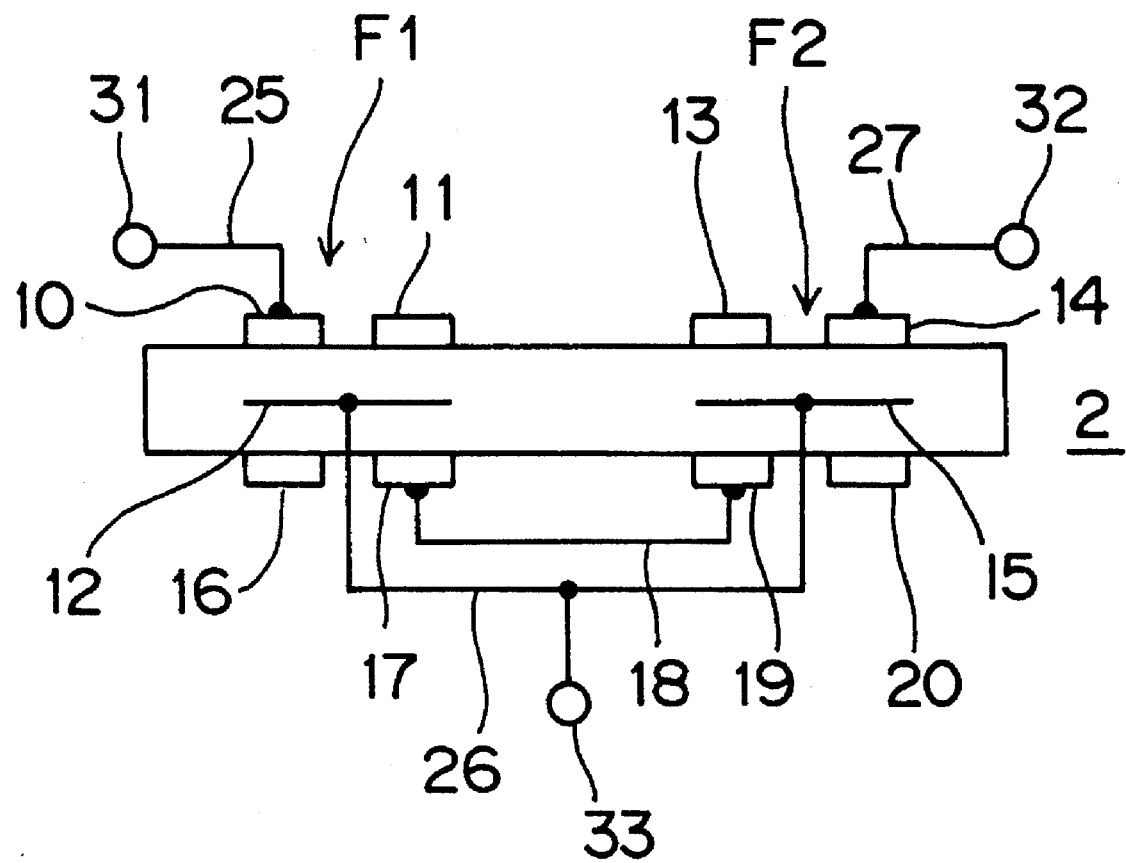

ELECTRICAL DEVICE PROVIDED WITH THREE TERMINALS

BACKGROUND OF THE INVENTION

1. Field of the Invention

The present invention relates to an electrical device, and more particularly to a device which is used for forming various kinds of electronic circuits such as an vibrator, a resonator and a filter.

2. Description of Related Art

Generally, an electric functional device which has three terminals is provided with two leading electrodes on a first (front) side of an element (substrate) and one leading electrode on a second (back) side. When these leading electrodes are soldered with terminals, the element is held between the three terminals. With the soldering, the terminals and the leading electrodes are connected electrically and also combined mechanically.

When all the leading electrodes have to be provided on the first side (or the second side) of the element for design, if the element is held between the three terminals and soldered as usual, at least one terminal can not be soldered to the leading electrode. Also, if the three terminals are provided facing to the first side, the element can not be held by the terminals and this causes an inconvenience in the production process.

SUMMARY OF THE INVENTION

An object of the present invention is to provide an electric functional device wherein, though all leading electrodes are provided on a first side of an element, all the electrodes can be soldered to terminals while the element is held between the terminals.

In order to attain the object, an electric functional device with three terminals according to the present invention is provided with an input leading electrode, an output leading electrode and a common leading electrode which is positioned between the input leading electrode and the output leading electrode on a first side of an element which has a specified function, the input, the output and the common leading electrodes being connected with the three terminals respectively, and at least one of the three terminals faces to a second side to hold the element between the three terminals. The terminal which faces to the second side and a leading electrode to be connected with that terminal are bridged with solder.

In the above structure, the element which has all the leading electrodes on the first side is held between the input terminal, the output terminal and the common terminal when the leading electrodes are soldered to the terminals. The terminal which faces to the first side is connected with the leading electrode electrically and fixed by normal soldering. On the other hand, the terminal which faces to the second side is connected electrically with a specified leading electrode which is provided on the first side by bridging with solder, and fixed.

Also, the electrical function of the element is a vibrating function, a resonating function or a filter function for selecting signals.

BRIEF DESCRIPTION OF THE DRAWINGS

This and other objects and features of the present invention will become apparent from the following description with reference to the accompanying drawings, in which:

FIG. 5 is a connecting diagram of the electric functional device shown in FIG. 2.

DETAILED DESCRIPTION OF THE PREFERRED EMBODIMENTS

The description of a preferred embodiment according to the present invention is given below, referring to the accompanying drawings.

In the embodiment below, the present invention is applied to a ceramic filter.

Figure 1:
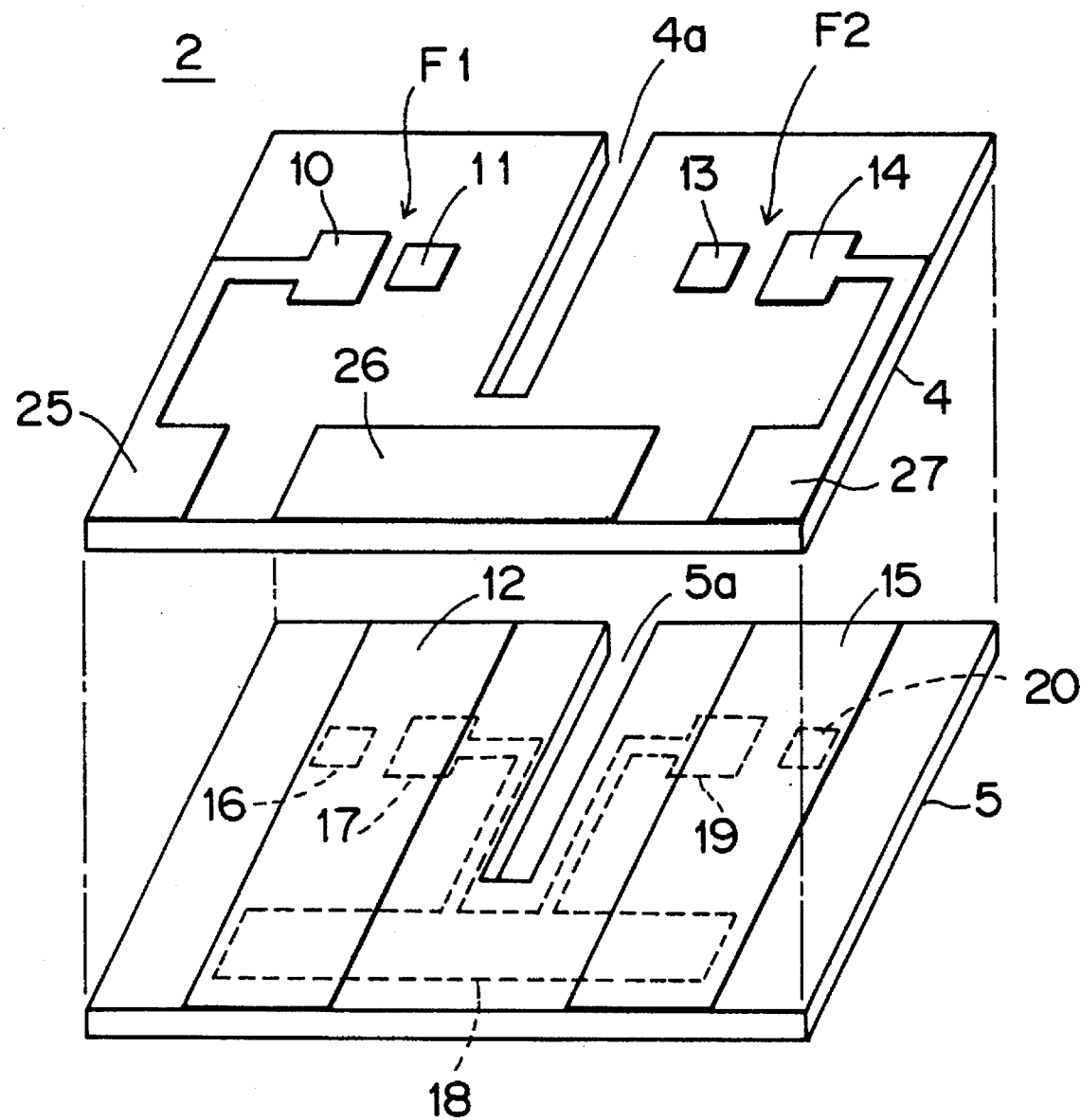
FIG. 1 is an exploded view which shows an element used in an embodiment of an electric functional device according to the present invention.

FIG. 1 shows an element 2 which functions as a piezoresonator which generates double harmonic wave. The element 2 is composed of two rectangular piezoelectric ceramic substrates 4 and 5. Vibrating electrodes 10 and 14 are provided on the substrate 4. The vibrating electrode 10 is connected with an input leading electrode 25 which is provided at the left end of the substrate 4, and the vibrating electrode 14 is connected with an output leading electrode 27 which is provided at the right end of the substrate 4. Also, a common leading electrode 26 is provided at the front end of the substrate 4 between the leading electrodes 25 and 27. Thus, all the leading electrodes 25, 26 and 27 are provided on the first side of the substrate 4.

Common vibrating electrodes 12 and 15 are provided at right and left on the first side of the substrate 5. Vibrating electrodes 17 and 19 are provided on the second side of the substrate 5. The vibrating electrodes 17 and 19 are connected electrically through a junction conductor 18. A surface of the junction conductor 18 is covered with solder resist ink 30 to prevent the junction conductor 18 from connecting electrically with a common terminal 33 (refer to FIG. 4).

Electrodes 11, 13, 16 and 20 are saved as dummy electrodes for balancing vibrations.

Figure 2:
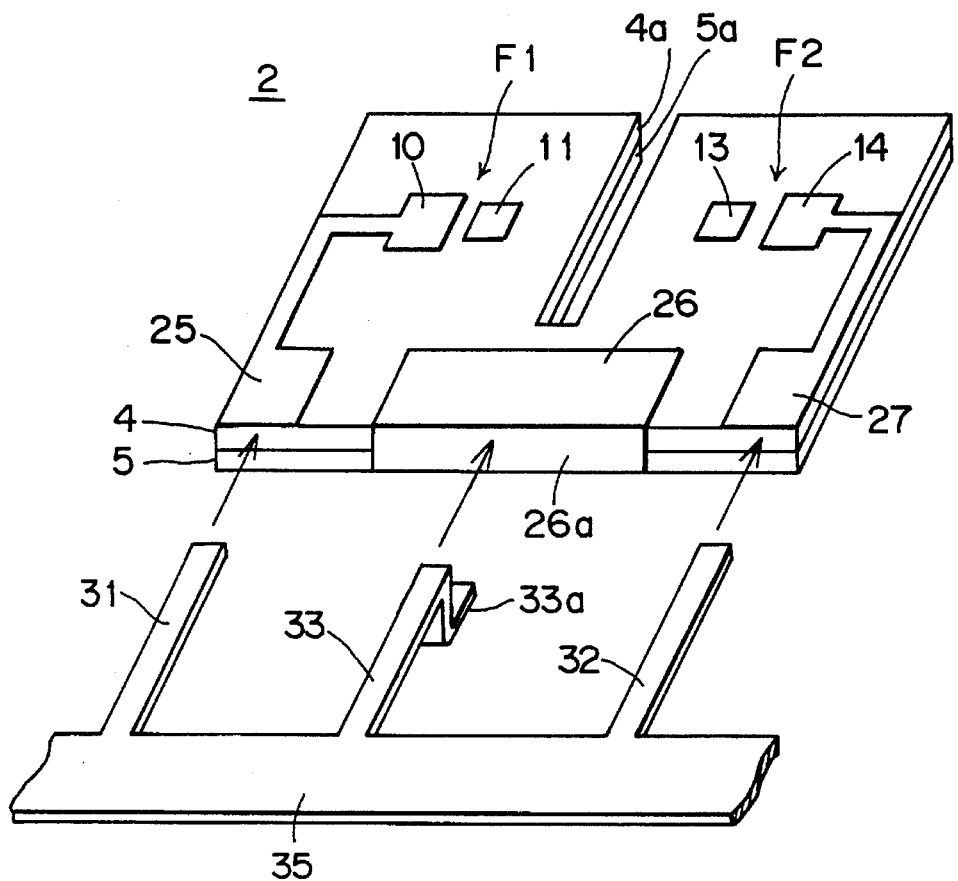
FIG. 2 is a perspective view which shows the element shown in FIG. 1 fitted to terminals.

The two substrates 4 and 5 are laminated in a body (refer to FIG. 2). In the construction that the substrates 4 and 5 are laminated, the vibrating electrodes 10, 12 and 17 form a filter F1, and the vibrating electrodes 19, 15 and 14 form a filter F2. These filters F1 and F2 vibrate in a thickness vibration mode of double harmonic wave. Also, cutouts 4a and 5a which are formed in the centers of the substrates 4 and 5 prevent mutual intervention of the filters F1 and F2.

As shown in FIG. 2, an end electrode 26a is provided on the element 2 in order to extend the electrodes 12 and 15 out to the leading electrode 26. Each electrode is formed by sputtering, vacuum evaporation, ion plating or printing/baking of the conductive paste.

An input terminal 31, an output terminal 32 and a common terminal 33 are provided in a body at a hoop material 35. In order to unite the element 2 and the terminals 81, 32 and 33, the element 2 is held between end portions of the terminals 31, 32 and 33. As explained below, the end portion 33a of the common terminal 33 is bent in L-shape for easy bridging with solder.

Figure 3:
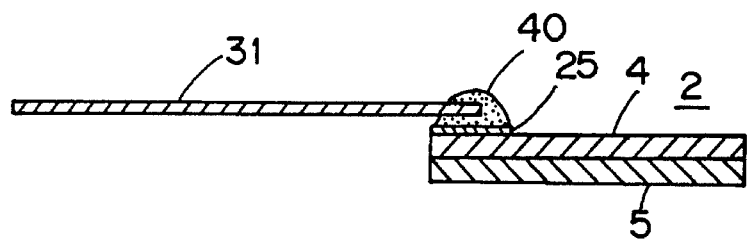
FIG. 3 is a sectional view which shows a connecting portion of an input terminal.

The input terminal 31 and the input leading electrode 25 are joined by ordinary soldering (refer to FIG. 3). A solder 40 connects the input leading electrode 25 and the input terminal 31 electrically and mechanically. In the same way, the output terminal 32 and the output leading electrode 27 are joined by ordinary soldering.

Figure 4:
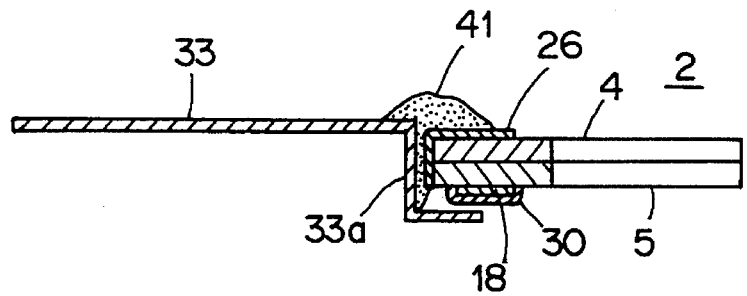
FIG. 4 is a sectional view which shows a connecting portion of a common terminal.

On the other hand, the common terminal 33 and the common leading electrode 26 are bridged with solder 41, and connected electrically and mechanically (refer to FIG. 4).

FIG. 5 shows a connection of the piezoresonator in the above structure.

As explained above, even when all the leading electrodes 25, 26 and 27 are provided on the first (front) side of the element 2, the element 2 can be held between the terminals 31, 32 and 33. Then, the terminals 31 and 32 which face to the first (front) side of the element 2 are connected with the input leading electrode 25 and the output leading electrode 27 respectively by ordinary soldering, and the terminal 33 which faces to the second (back) side of the element 2 is connected with the common leading electrode 26 by solder bridging.

In the above embodiment, the common terminal and the common leading electrode are bridged with solder. However, it is also possible that the input terminal and the input leading electrode, and the output terminal and the output leading electrode are bridged with solder. In this case, the end portions of the input terminal and the output terminal are bent and face to the second side of the element, and the end portion of the common terminal are extended straight and faces to the first side.

Also, an end of a terminal which is bridged with solder does not have to be L-shape, and various shapes which fit a shape of an element can be applied.

Although the present invention has been described in connection with the preferred embodiment above, it is to be noted that various changes and modifications are apparent to a person skilled in the art. Such changes and modifications are to be understood as being within the scope of the present invention.

What is claimed is:

1. An electrical device comprising:

an element which has a specified electrical function, the element having a first side and second side, the first side being provided with an input leading electrode, an output leading electrode and a common leading electrode which is positioned between the input leading electrode and the output leading electrode;

an input terminal which is connected electrically with the input leading electrode by soldering;

an output terminal which is connected electrically with the output leading electrode by soldering; and a common terminal which is connected electrically with the common leading electrode by soldering; and at least one of the input terminal, the output terminal and the common terminal faces the first side of the element and at least one of the other terminals faces the second side of the element to hold the element in between, and the terminal which faces the second side and the leading electrode connected with that terminal are electrically connected by a solder bridge.

2. An electrical device as claimed in claim 1, wherein:

the input terminal and the output terminal face to the first side of the element and are connected with the input leading electrode and the output leading electrode respectively by soldering; and an end portion of the common terminal is bent and faces to the second side of the element, and the end portion and the common leading electrode are bridged with solder.

3. A filter comprising:

a piezoelectric resonator which comprises a substrate and vibrating electrodes formed thereon, the substrate having a first side and a second side, the first side being provided with an input leading electrode, an output leading electrode and a common leading electrode which is positioned between the input leading electrode and the output leading electrode;

an input terminal which is connected electrically with the input leading electrode by soldering;

an output terminal which is connected electrically with the output leading electrode by soldering; and a common terminal which is connected electrically with the output leading electrode by soldering; and at least one of the input terminal, the output terminal and the common terminal faces the first side of the substrate and at least one of the other terminals faces the second side of the substrate to hold the substrate in between, and the terminal which faces to the second side and the leading electrode connected with that terminal are electrically connected by a solder bridge.

4. A filter as claimed in claim 3, wherein:

the input terminal and the output terminal face the first side of the substrate and are connected with the input leading electrode and the output leading electrode respectively by soldering; and an end portion of the common terminal is bent and faces the second side of the substrate, and the end portion and the common leading electrode are bridged with solder.

* * * * *